United States Patent
Kasai

(10) Patent No.: US 9,431,464 B2
(45) Date of Patent: Aug. 30, 2016

(54) ORGANIC ELECTROLUMINESCENCE DEVICE, SEMICONDUCTOR DEVICE, AND ELECTRONIC APPARATUS

(71) Applicant: SEIKO EPSON CORPORATION, Tokyo (JP)

(72) Inventor: Toshiyuki Kasai, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/607,520

(22) Filed: Jan. 28, 2015

(65) Prior Publication Data

US 2015/0243714 A1 Aug. 27, 2015

(30) Foreign Application Priority Data

Feb. 21, 2014 (JP) .................. 2014-031841

(51) Int. Cl.
*H01L 27/32* (2006.01)
*G09G 3/00* (2006.01)
*G09G 3/32* (2016.01)

(52) U.S. Cl.
CPC ........... *H01L 27/3225* (2013.01); *G09G 3/002* (2013.01); *G09G 3/3233* (2013.01)

(58) Field of Classification Search
CPC ........... H01L 51/0545; H01L 51/0036; H01L 51/0541; H01L 51/5012; B82Y 10/00
See application file for complete search history.

(56) References Cited

U.S. PATENT DOCUMENTS

| 6,414,740 B1* | 7/2002 | Hosoyamada .... G02F 1/133382 349/161 |
| 2005/0156838 A1 | 7/2005 | Miyagawa et al. |
| 2008/0094009 A1* | 4/2008 | Koyama ............. G09G 3/3216 315/307 |
| 2008/0143652 A1 | 6/2008 | Hasegawa et al. |

FOREIGN PATENT DOCUMENTS

| JP | 2000338518 A | 12/2000 |
| JP | 2004205704 A | 7/2004 |
| JP | 2005181917 A | 7/2005 |
| JP | 2007065419 A | 3/2007 |
| JP | 2008152088 A | 7/2008 |
| JP | 2009169329 A | 7/2009 |
| JP | 2011013551 A | 1/2011 |
| JP | 2012159633 A | 8/2012 |
| JP | 2012226062 A | 11/2012 |

* cited by examiner

*Primary Examiner* — Michelle Mandala
(74) *Attorney, Agent, or Firm* — Oliff PLC

(57) ABSTRACT

An organic electroluminescence device includes a substrate, an organic electroluminescence element provided at a pixel region of the substrate, a connection terminal provided at a terminal region of the substrate, and a temperature sensor provided above the substrate, in which the temperature sensor is provided between the pixel region and the terminal region.

11 Claims, 7 Drawing Sheets

ORGANIC ELECTROLUMINESCENCE DEVICE, SEMICONDUCTOR DEVICE, AND ELECTRONIC APPARATUS

BACKGROUND

1. Technical Field

The present invention relates to an organic electroluminescence device, a semiconductor device, and an electronic apparatus.

2. Related Art

In the related art, a display device using an electro-optical element such as an organic electroluminescence element and the like has been put to practical use. Hereinafter, an organic electroluminescence (Electro-Luminescence) is abbreviated as organic EL. In this type of display device, a pixel circuit that controls a current supplied to an electro-optical element according to a gate potential of a transistor is used. This type of transistor is referred to as a drive transistor. In general, the characteristics of the electro-optical element and the drive transistor are changed due to the influence of temperature. Therefore, the current supplied to the electro-optical element is changed according to a change in temperature, the brightness of an image is changed, and the like, thereby causing deterioration in the display quality in some cases.

In JP-A-2012-159633, in order to reduce an adverse effect on a display due to heat emitted from a lamp in a projector, a liquid crystal light valve with a temperature sensor for detecting the temperature as a guide for adjusting the degree of cooling has been disclosed.

In JP-A-2012-159633, an example of placing a temperature sensor at six places on an active matrix substrate configuring a liquid crystal light valve is disclosed. In this configuration, even if the temperature of a substrate can be detected, an area occupied by the temperature sensors is increased. Therefore, even if this configuration is applied to the organic EL device, there is a possibility that the size of the organic EL device is inhibited from becoming small because of the area of the six temperature sensors. Therefore, a configuration which can detect an exact temperature with fewer temperature sensors is required. This problem is not limited to the organic EL device, but is a common problem in semiconductor devices such as a CMOS image sensor and the like.

SUMMARY

An advantage of an aspect of the invention is to provide an organic EL device which can obtain exact temperature information with fewer temperature sensors. In addition, an advantage of another aspect of the invention is to provide a semiconductor device which can obtain exact temperature information with fewer temperature sensors. Moreover, an advantage of still another aspect of the invention is to provide an electronic apparatus which includes a display unit with an excellent display quality.

According to an aspect of the invention, there is provided an organic electroluminescence device includes a substrate, an organic electroluminescence element provided at a pixel region of the substrate, a connection terminal provided at a terminal region of the substrate, and a temperature sensor provided above the substrate, in which the temperature sensor is provided between the pixel region and the terminal region.

The present inventors have focused on the fact that the amount of heat generated in the pixel region including an organic EL element is the most in the organic EL device, and focused on a heat conduction path through which the heat generated in the pixel region flows to the outside from the terminal region through the substrate. In this case, since the temperature sensor is provided in a region between the pixel region and the terminal region, that is, the heat conduction path, a temperature can be efficiently detected and exact temperature information can be obtained with fewer temperature sensors.

In the organic EL device, the substrate may be a semiconductor substrate.

In this case, a transistor which configures a pixel circuit or a drive circuit can be directly formed on a semiconductor substrate without using a thin film transistor.

In the organic EL device, the temperature sensor may include a band gap reference circuit formed on the semiconductor substrate.

In this case, a temperature can be detected using an output signal from the band gap reference circuit configured to have elements such as a resistance formed on the semiconductor substrate, a transistor, and the like.

The organic EL device may further include a drive circuit region which includes a drive circuit that drives the organic electroluminescence element outside the pixel region on the substrate, in which the temperature sensor may be provided between the drive circuit region and the terminal region.

In the organic EL device, in addition to the pixel region, the drive circuit region becomes one of heat sources in some cases. In this case, since a temperature sensor is provided in a heat conduction path from the drive circuit region to the terminal region, a temperature obtained by taking into account the influence of heat transferred from the drive circuit region in addition to heat transferred from the pixel region can be detected. Accordingly, more accurate temperature detection can be performed.

According to another aspect of the invention, there is provided a semiconductor device, including a semiconductor substrate, a pixel region provided on the semiconductor substrate, a terminal region which includes an external connection terminal provided on the semiconductor substrate, and a temperature sensor provided on the semiconductor substrate, in which the temperature sensor is provided between the pixel region and the terminal region.

In this case, since the temperature sensor is provided between the pixel region and the terminal region, a temperature can be efficiently detected, and exact temperature information can be obtained with fewer temperature sensors.

According to still another aspect of the invention, there is provided an electronic apparatus, including the organic EL device according to the aspect of the invention.

In this case, an electronic apparatus which includes a display unit with excellent display quality can be realized by providing the organic EL device according to the aspect of the invention as a display unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to FIGS. 1 to 7.

In this embodiment, an example of an organic EL device configured using a silicon substrate will be described.

In order to make each component clear to see in each of following drawings, the scale of size is indicated differently for each component.

Figure 1:
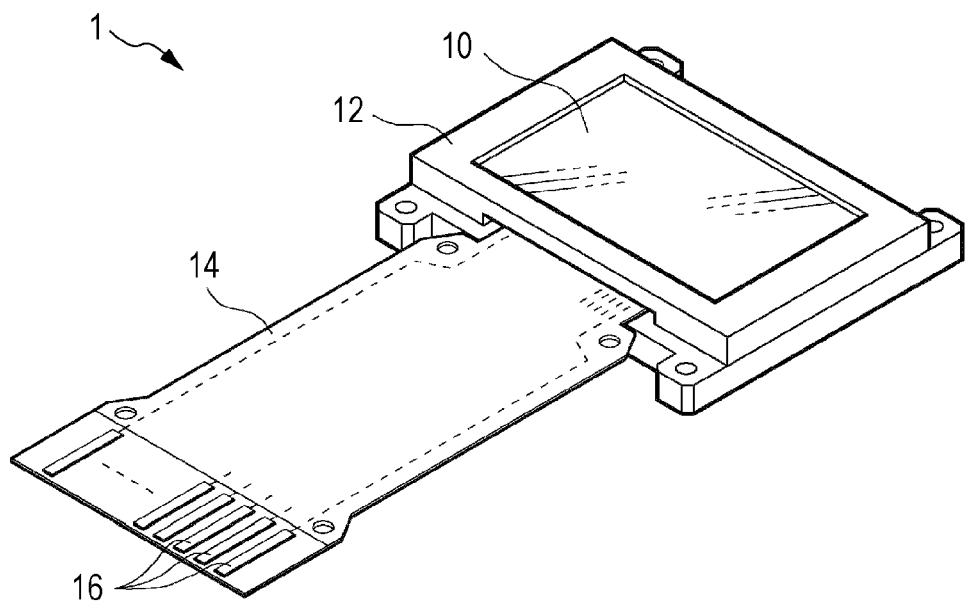
FIG. 1 is a perspective view which shows an organic EL device of a first embodiment of the invention.

FIG. 1 is a perspective view which shows an organic EL device according to the first embodiment.

As shown in FIG. 1, an organic EL device 1 is applied to, for example, a head-mounted display and functions as a micro-display 10 which displays an image. That is, the micro-display 10 is configured to have an organic EL device in which a plurality of pixel circuits and a drive circuit which drives the pixel circuit are formed on a semiconductor substrate such as silicon substrate and the like. The pixel circuit includes an organic EL which is an example of a light emitting element. In the following description, a silicon substrate is described as an example of an appropriate semiconductor substrate in the embodiment; however, a semiconductor substrate made of other known semiconductor materials is also applicable.

The micro-display 10 is stored in a case 12 of a frame shape having an opening. An end of a Flexible Printed Circuits (FPC) substrate 14 is connected to the micro-display 10. A plurality of terminals 16 are provided at the other end of the FPC substrate 14, and are connected to a circuit module which is not shown. The circuit module connected to the terminal 16 also serves as a power circuit and a control circuit of the micro-display 10. The circuit module supplies various potentials through the FPC substrate 14, and also supplies a data signal, a control signal, or the like.

Figure 2:
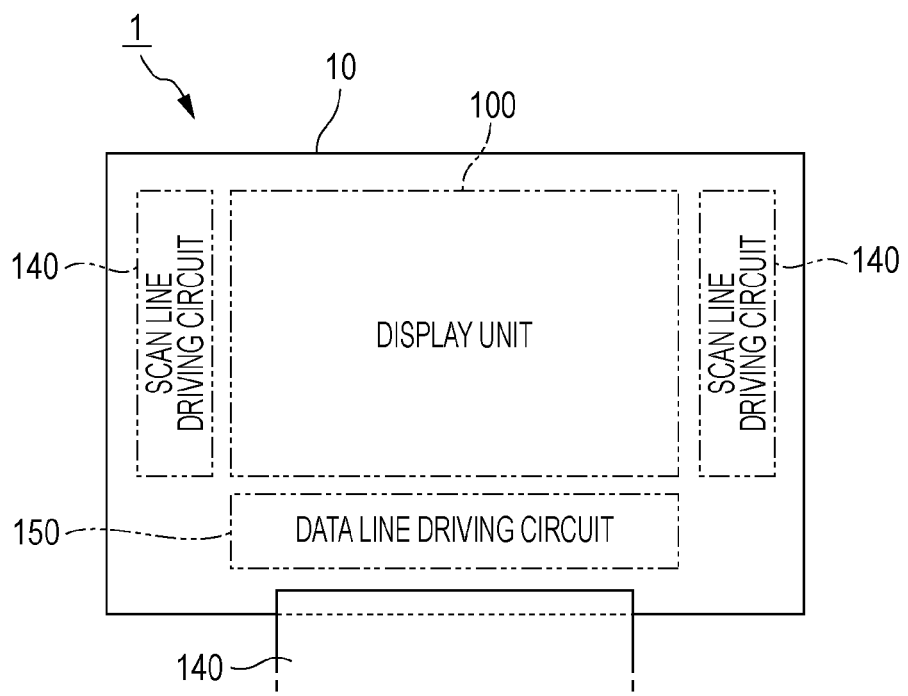
FIG. 2 is a plan view which shows an arrangement of each region of the organic EL device.

FIG. 2 is a plan view which shows an arrangement of each portion in the micro-display 10.

Figure 3:
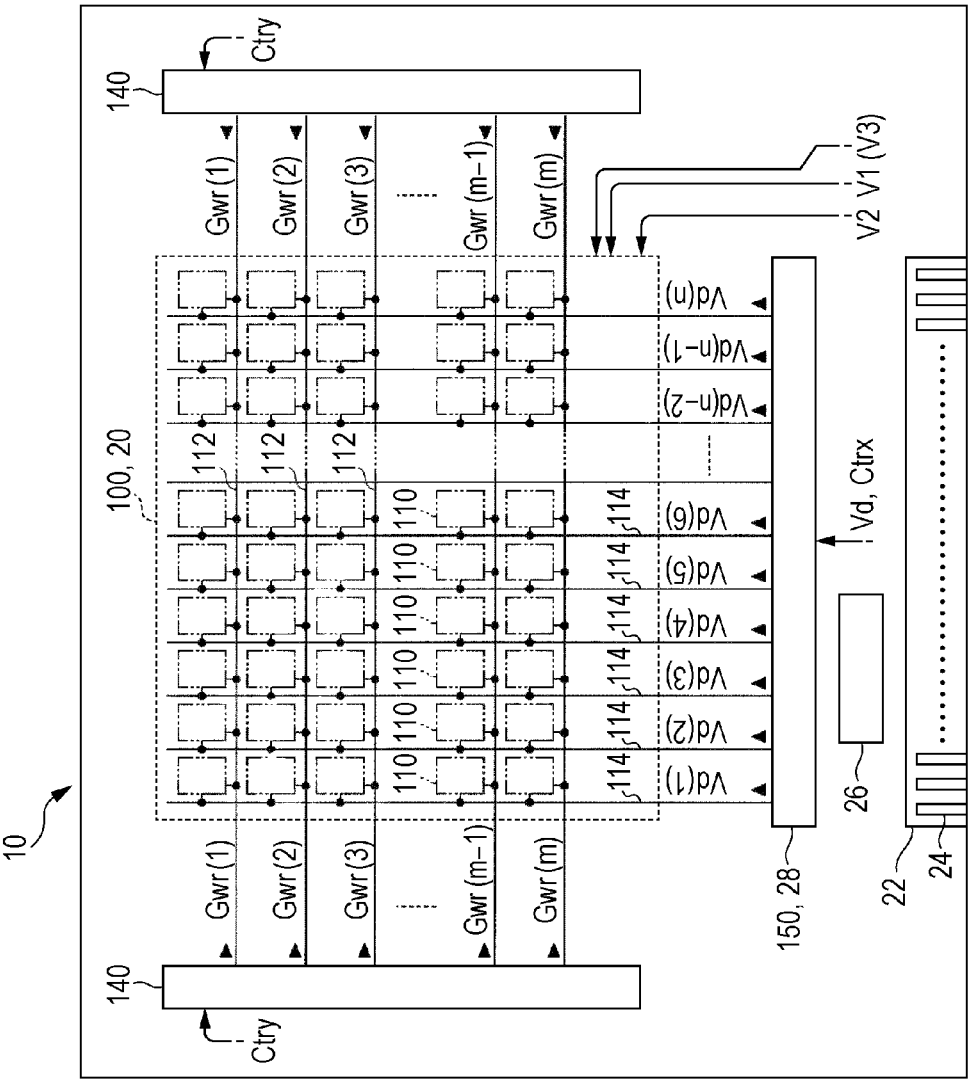
FIG. 3 is a block diagram which shows an electrical configuration of the organic EL device.

FIG. 3 is a block diagram which shows an electrical configuration in the micro-display 10. FIG. 2 shows a state after removing the case 12 in FIG. 1 for convenience of description.

In FIG. 2, a display unit 100 has, for example, diagonally a size of about 1 inch in a plan view, and has a horizontally long rectangular shape in a horizontal direction of the figure.

Specifically, as shown in FIG. 3, m rows of scan lines 112 are provided along the horizontal direction of the figure in the display unit 100. In addition, n columns of data lines 114 are provided in a state of being electrically insulated from each of the scan lines 112 along a vertical direction of the figure. As described above, a plurality of pixel circuits 110 are arranged in a matrix shape corresponding to each intersection between m rows of scan lines 112 and n columns of data lines 114 in the display unit 100. That is, a pixel region 20 in which a plurality of pixel circuits 110 are arranged in a matrix shape configures the display unit 100.

Both m and n are natural numbers.

Hereinafter, rows from the top in FIG. 3 may be sequentially referred to as $1^{st}$, $2^{nd}$, $3^{rd}$, ..., $(m-1)^{th}$, and $m^{th}$ rows to conveniently distinguish rows among a plurality of scan lines 112 and a plurality of pixel circuits 110. Columns from the left in FIG. 3 may be sequentially referred to as $1^{st}$, $2^{nd}$, $3^{rd}$, ..., $(n-1)^{th}$, and $n^{th}$ columns to conveniently distinguish columns among a plurality of data lines 114 and the plurality of pixel circuits 110.

In practice, three pixel circuits 110 corresponding to intersections between, for example, the scan line 112 of one row and adjacent data lines 114 of three columns correspond to pixels of red (R), green (G), and blue (B), respectively. These three pixels correspond to one dot of a color image to be displayed. In other words, the embodiment has a configuration in which a color of one dot is represented by an additive color mixture using light-emitting elements of three pixel circuit 110 of red (R), green (G), and blue (B).

A drive circuit (peripheral circuit) for driving the pixel circuit 110 is provided in the periphery of the display unit 100. In the embodiment, the drive circuit includes scan line drive circuits 140 and a data line drive circuit 150. At both the right and left sides of the display unit 100, the scan line drive circuits 140 are provided apart from the display unit 100. Two scan line drive circuits 140 are configured to drive each of the m rows of scan lines 112 from both sides thereof, respectively. Each of the scan line drive circuits 140 is supplied with the same control signals Ctry from the circuit module, and supplies each of scan signals Gwr(1), Gwr(2), Gwr(3), ..., Gwr(m-1), and Gwr(m) to $1^{st}$, $2^{nd}$, $3^{rd}$, ..., $(m-1)^{th}$, and $m^{th}$ scan lines 112.

When a delay of the scan signal is not problematic during a supply of the scan signal, the scan line drive circuit 140 may be configured to have only one side.

As shown in FIGS. 2 and 3, the data line drive circuit 150 is provided at a distance from the display unit 100 between the terminal region 22 connected to the FPC substrate 14 and the display unit 100. The terminal region 22 is a region in which a plurality of external connection terminals 24 connected to the FPC substrate 14 are provided.

An image signal Vd and a control signal Ctrx are supplied from the circuit module to the data line drive circuit 150. The data line drive circuit 150 supplies an image signal Vd to $1^{st}$, $2^{nd}$, $3^{rd}$, ..., $(n-1)^{th}$, and a $n^{th}$ column data lines 114 as image signals Vd(1), Vd(2), Vd(3), ..., Vd(n-1), and Vd(n) according to the control signal Ctrx. Moreover, potentials V1 and V2 are supplied over each pixel circuit 110 through the FPC substrate 14 from the circuit module in the display unit 100 of the embodiment.

The temperature sensor 26 is provided between the display unit 100 which is the pixel region 20 and the terminal region 22. More specifically, the temperature sensor 26 is arranged in a region between the display unit 100 which is the pixel region 20 and the terminal region 22, that is, in a region interposed between a section across both ends of an arrangement of a plurality of external connection terminals 24 and a section (a width of the pixel region 20) across both ends of an arrangement of a plurality of pixel circuits 110. That is, the temperature sensor 26 is provided on a line connecting any one of the pixel regions 20 and any one of the plurality of external connection terminals 24. Furthermore, the temperature sensor 26 is provided between the drive circuit region 28 which is made of the data line drive circuit 150 and the terminal region 22.

More specifically, the temperature sensor 26 is arranged in a region between the drive circuit region 28 and the terminal region 22, that is, in a region interposed between a section across both ends of an arrangement of the plurality of external connection terminals 24 and a section corresponding to a width of the data line drive circuit 150. A configuration of the temperature sensor 26 will be described in detail below. The plurality of pixel circuits 110 in the pixel region 20, the temperature sensor 26, the scan line drive circuit 140, and the data line drive circuit 150 are all formed on a semiconductor substrate. Then, an active layer of a semiconductor element such as a transistor and the like which configure these circuits is provided in the semiconductor substrate. The active layer is a channel region, a source region, a drain region, and the like of a transistor.

Scan signals Gwr(1) to Gwr(m) output by the scan line drive circuit 140 are logical signals defined as an H or L level. Therefore, the scan line drive circuit 140 is a combination of Complementary Metal Oxide Semiconductor (CMOS) logical circuits which operate according to a control signal Ctry. In addition, a high side of a power supply is set to a potential Vdd, and a low side is set to a potential Vss in the scan line drive circuit 140. Therefore, an H level corresponds to the potential Vdd, and an L level corresponds to the potential Vss in the scan signals Gwr(1) to Gwr(m).

Figure 4:
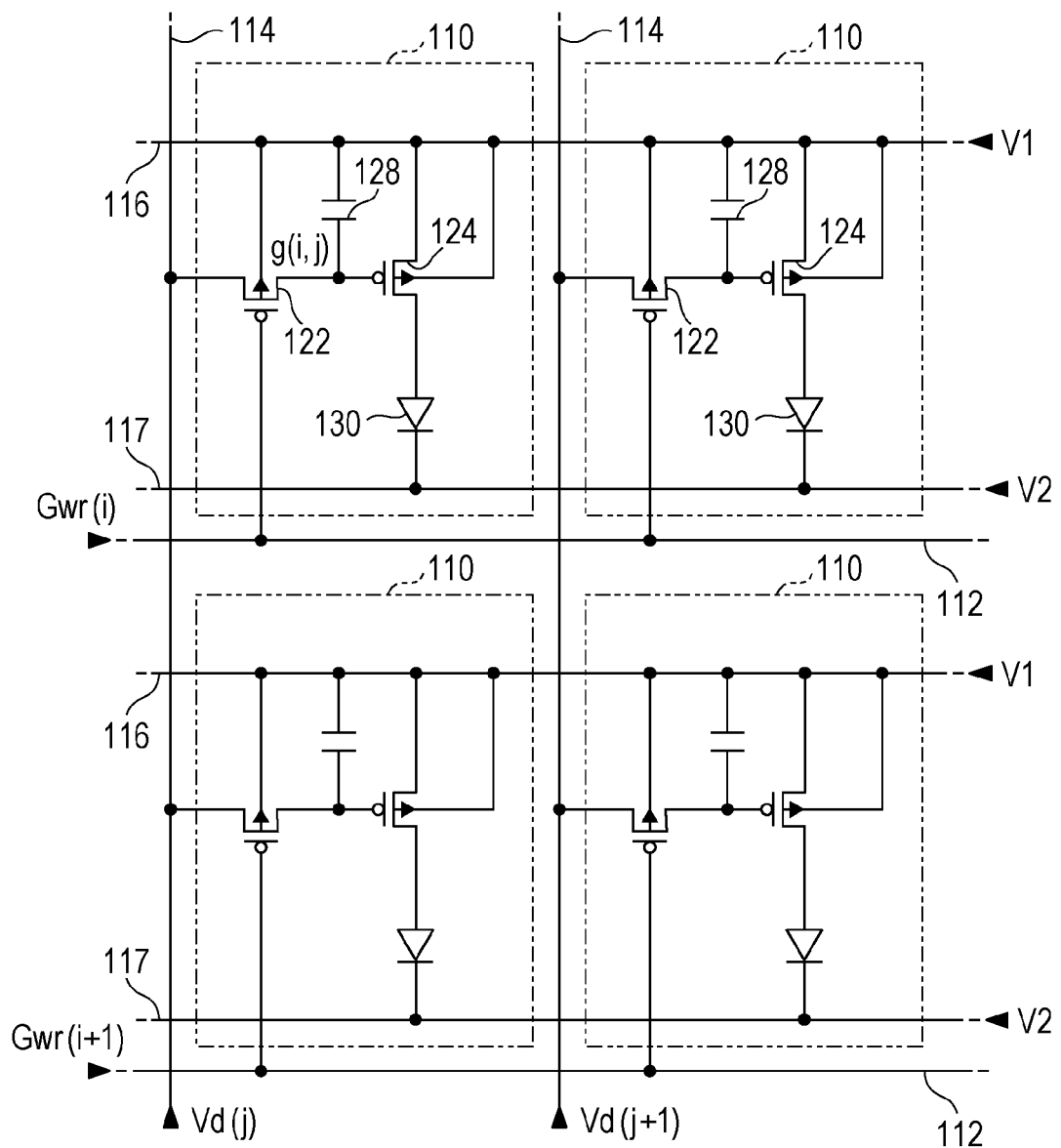
FIG. 4 is a diagram which shows a pixel circuit of the organic EL device.

FIG. 4 is a circuit diagram of the pixel circuit 110. FIG. 4 shows the pixel circuits 110 corresponding to a total of four 2×2 pixels according to intersections between the scan lines 112 in an $i^{th}$ row and an $(i+1)^{th}$ row that is adjacent at a lower side with respect to the $i^{th}$ row, and the data lines 114 in a $j^{th}$ column and a $(j+1)^{th}$ column that is adjacent at a right side with respect to the $j^{th}$ column. "i" and "(i+1)" are symbols used to generally indicate a row in which the pixel circuits 110 are arrayed, and are integers from 1 to m. In the same manner, "j" and "(j+1)" are symbols used to generally indicate a column in which the pixel circuits 110 are arrayed, and are integers from 1 to n.

As shown in FIG. 4, the pixel circuit 110 includes P channel MOS transistors 122 and 124, a capacitor 128, and an organic EL 130. Since the pixel circuits 110 have electrically the same configuration as each other, a pixel circuit located at the $i^{th}$ row and the $j^{th}$ column will be described as representative.

The transistor 122 of the pixel circuit 110 in the $i^{th}$ row and the $j^{th}$ column functions as a switching transistor. A gate node of the transistor 122 is connected to the scan line 112 in the $i^{th}$ row, and one each of a source node and a drain node is connected to a data line 114 in the $j^{th}$ column, and the other of the source node and the drain node is connected to one end of the capacitor 128 and a gate node of the transistor 124, respectively.

The source node of the transistor 124 is connected to both the other end of the capacitor 128 and a feeder line 116 which feeds a potential V1 at a high side of the power supply, and a drain node of the transistor 124 is connected to an anode of the organic EL 130. The transistor 124 is a drive transistor, and a current corresponding to a holding voltage from the capacitor 128, that is, a voltage between a gate and a source, is supplied to the organic EL 130.

The anode of the organic EL 130 is a pixel electrode individually provided for each pixel circuit 110. A cathode of the organic EL 130 is a common electrode 117 covering all of the pixel circuits 110, and a potential V2 at a low side of the power supply is fed thereto. The organic EL 130 is a device obtained by interposing a light-emitting layer made of an organic EL material using an anode and a cathode with transparency, which face each other, on a silicon substrate, and emits light at a brightness corresponding to a current flowing toward the cathode from the anode.

In FIG. 4, Gwr(i) and Gwr(i+1) indicate a scan signal supplied to scan lines 112 in an $i^{th}$ row and an $(i+1)^{th}$ row, respectively. Vd(j) and Vd(j+1) indicate a data signal supplied to data lines 114 in a $j^{th}$ column and a $(j+1)^{th}$ column, respectively. In addition, a gate node of the transistor 124 in the pixel circuit 110 of $i^{th}$ row and $j^{th}$ column is marked as g(i,j) for convenience. With regard to the capacitor 128, parasitic capacitance at the gate node of the transistor 124 is sometimes used.

Figure 5:
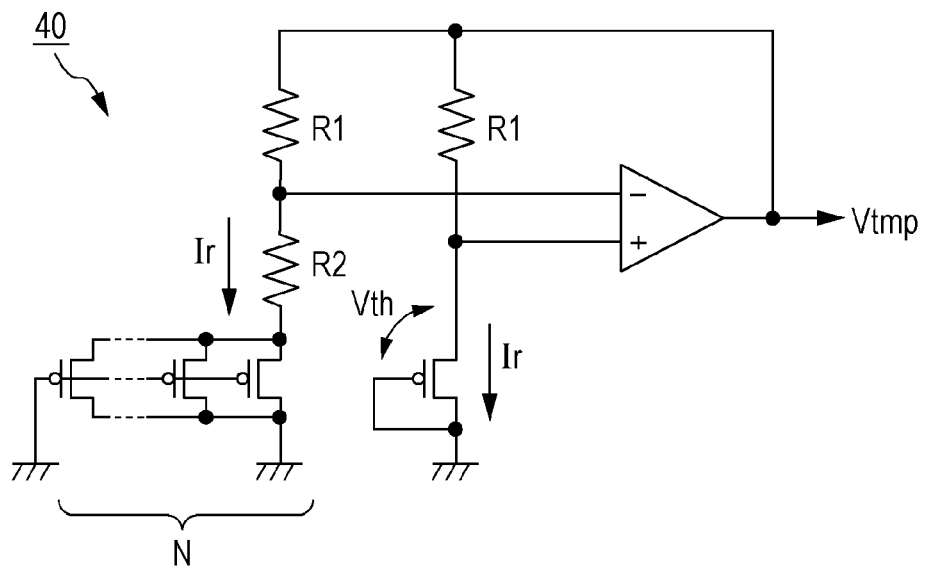
FIG. 5 is a diagram which shows a configuration example of a band gap reference circuit that configures a temperature sensor.

The temperature sensor 26 includes a band gap reference circuit 40 formed on the silicon substrate. The band gap reference circuit 40 outputs a temperature signal which shows a voltage corresponding to a temperature. FIG. 5 shows a detailed configuration of the band gap reference circuit 40. Although not shown in the figure, the temperature sensor 26 further includes a counter which outputs count data by counting a horizontal synchronization signal, a DAC circuit which outputs a count signal by performing a DA conversion on the count data, a comparator which compares the temperature signal and the count signal, and the like. This type of temperature sensor is well known, and detailed description on an operation thereof and the like will be omitted.

In the band gap reference circuit 40, a temperature signal Vtmp is given in a formula shown in the following.

$$Vtmp = Vth + (KT/q)(R1 \cdot \ln N/R2)$$

Further, K is Boltzmann's constant $(=1.381 \times 10^{-23} [m^2 \cdot kg/s^2 \cdot K])$, T is an absolute temperature [K], and q is an elementary charge $(=1.602 \times 10^{-19} [C])$.

Figure 6:
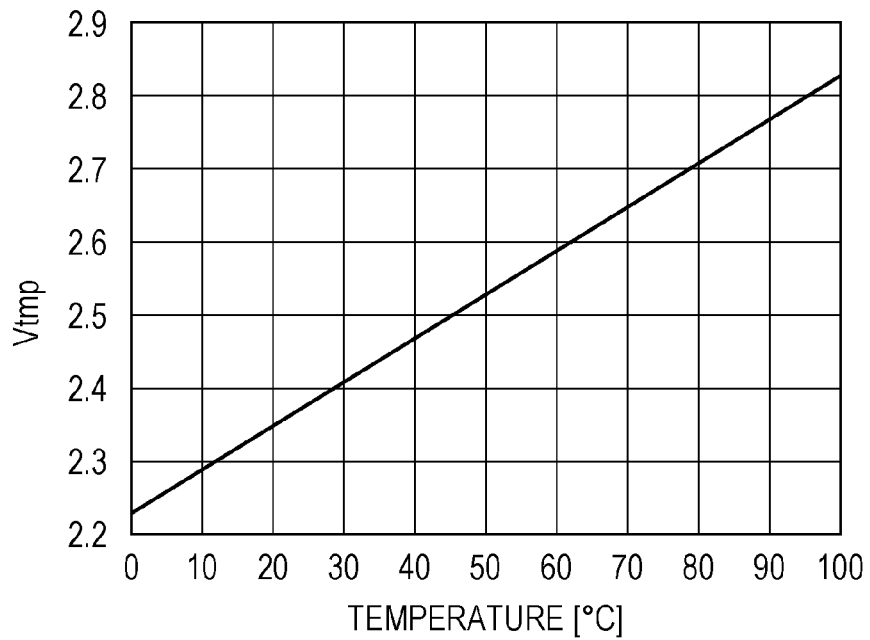
FIG. 6 is a graph which shows a characteristic example of the band gap reference circuit.

For example, as shown in FIG. 6, a temperature signal Vtmp when R1 is 1 MΩ and R2 is 10 MΩ has a property of increasing as temperature gets higher. From such a correlation between temperature and a temperature signal, the temperature sensor 26 can detect a temperature of the organic EL device 1 based on the temperature signal Vtmp output from the band gap reference circuit 40.

Temperature information obtained by the temperature sensor 26 is used in controlling various types of operations of the organic EL device 1. For example, when a current temperature is detected to be higher than a standard operation temperature, operations which suppresses heat emission such as operations to reduce power consumption, lower an operation frequency, stop some circuits, reduce light emitting time, and the like are performed.

Figure 7:
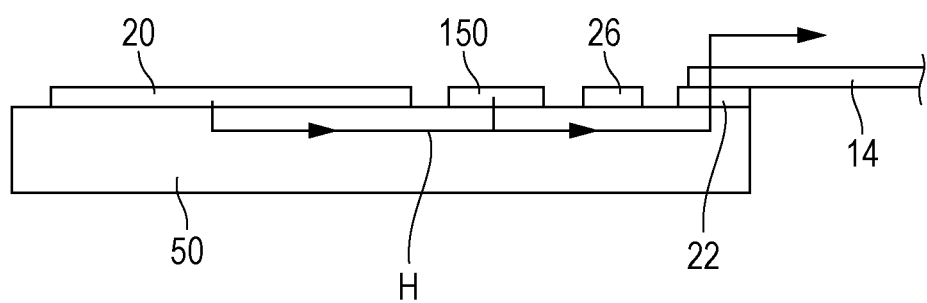
FIG. 7 is a view which shows a heat conduction path in the organic EL device.

As shown in FIG. 7, in the organic EL device 1 of the embodiment, a lot of heat is generated in the pixel region 20 which includes an organic EL element during an operation, and a heat conduction path is formed through which the heat is transferred from the terminal region 22 to the FPC substrate 14 through the semiconductor substrate 50. The heat conduction path is indicated by an arrow with a code of H. In the organic EL device 1 of the embodiment, since the temperature sensor 26 is provided in a region between the pixel region 20 and the terminal region 22, that is, on the heat conduction path H, the temperature sensor 26 can efficiently detect temperature, and can obtain exact temperature information with fewer temperature sensors. In particular, since the temperature sensor 26 is not externally attached, but is directly built onto the semiconductor substrate 50, temperature detection with higher accuracy can be performed.

Furthermore, in addition to the pixel region 20, a drive circuit region, particularly the data line drive circuit 150 becomes one of heat sources in the organic EL device 1 in some cases. With regard to this, as shown in FIG. 7, since the temperature sensor 26 is provided on the heat conduction path H which is directed toward the terminal region 22 from the data line drive circuit 150 according to a configuration of the embodiment, it is possible to detect a temperature which is obtained by taking into account the influence of heat transferred from the data line drive circuit 150 in addition to heat transferred from the pixel region 20. Accordingly, temperature detection with higher accuracy can be performed.

Second Embodiment

Hereinafter, a second embodiment of the invention will be described using FIG. 8.

A basic configuration of an organic EL device of the second embodiment is the same as that of the first embodiment and a position of the temperature sensor is different from that in the first embodiment.

Figure 8:
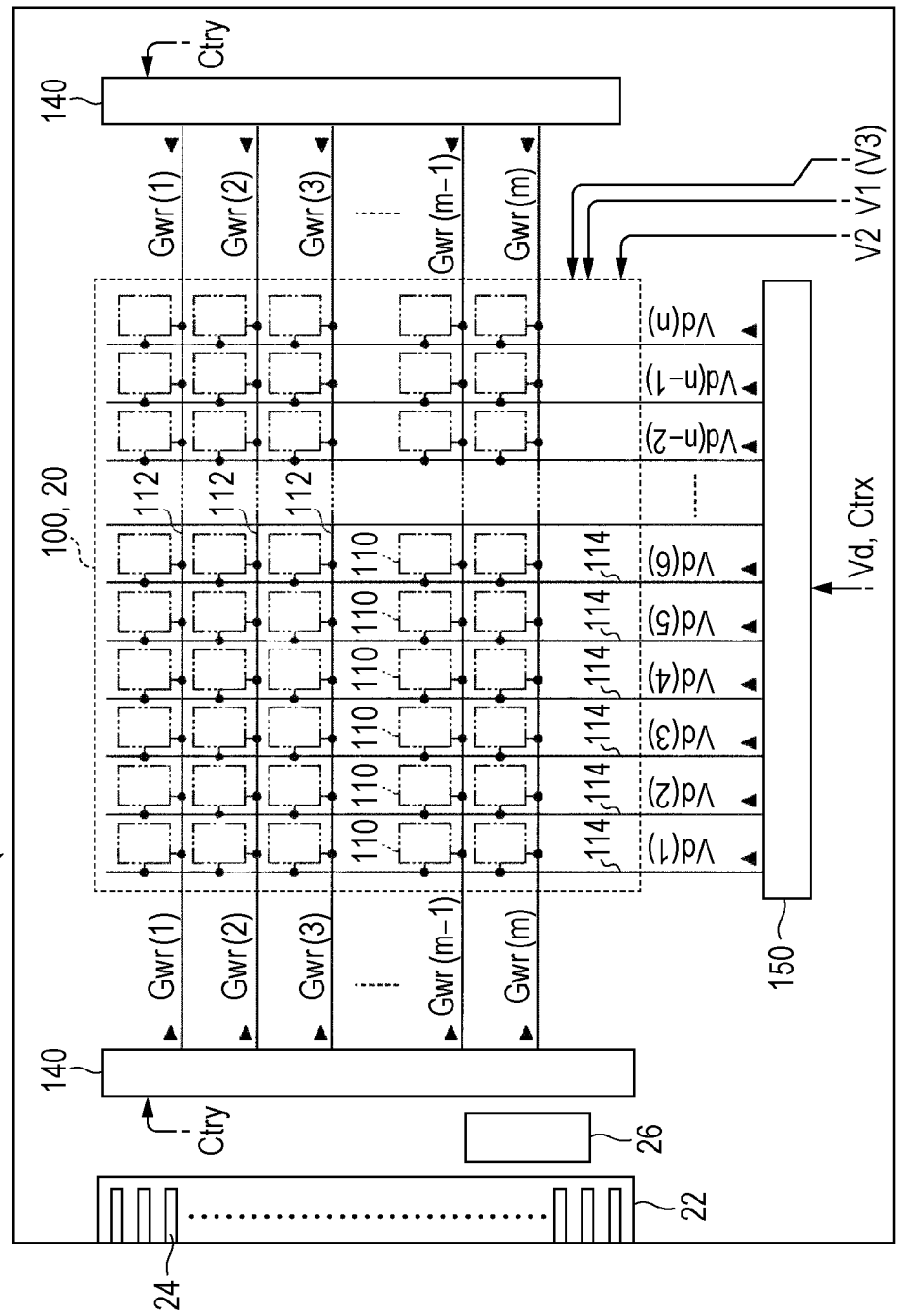
FIG. 8 is a plan view which shows an organic EL device of a second embodiment of the invention.

FIG. 8 is a plan view which shows an organic EL device of the second embodiment.

In FIG. 8, the same reference symbols are used for components in common with those in FIG. 3 used in the first embodiment, and detailed description thereof will be omitted.

As shown in FIG. 8, the terminal region 22 which includes a plurality of external connection terminals 24 is provided outside one (left side in FIG. 8) of the scan line drive circuits 140 in the organic EL device 11 of the embodiment. The temperature sensor 26 is provided between the pixel region 20 and the terminal region 22, particularly between the scan line drive circuit 140 and the terminal region 22. More specifically, the temperature sensor 26 is arranged in a region between the scan line drive circuit 140 and the terminal region 22, that is, in a region interposed between a section across both ends of an arrangement of the plurality of external connection terminals 24 and a section corresponding to a width of the scan line drive circuit 140. The other configurations are the same as those in the first embodiment. The configuration of the temperature sensor 26 is also the same as in the first embodiment.

In the organic EL device 11 of the embodiment, it is possible to obtain the same effect as in the first embodiment such that exact temperature information is obtained with fewer temperature sensors. The embodiment has a configuration in which the influence of heat from the data line drive circuit 150 is hardly reflected in the detection of a temperature. However, since the temperature sensor 26 is arranged between the pixel region 20 and the terminal region 22, the embodiment has a configuration in which the influence of heat from the pixel region is likely to be detected.

Electronic Apparatus

Hereinafter, a head-mounted display to which the micro-display 10 according to the embodiments is applied will be described.

Figure 9:
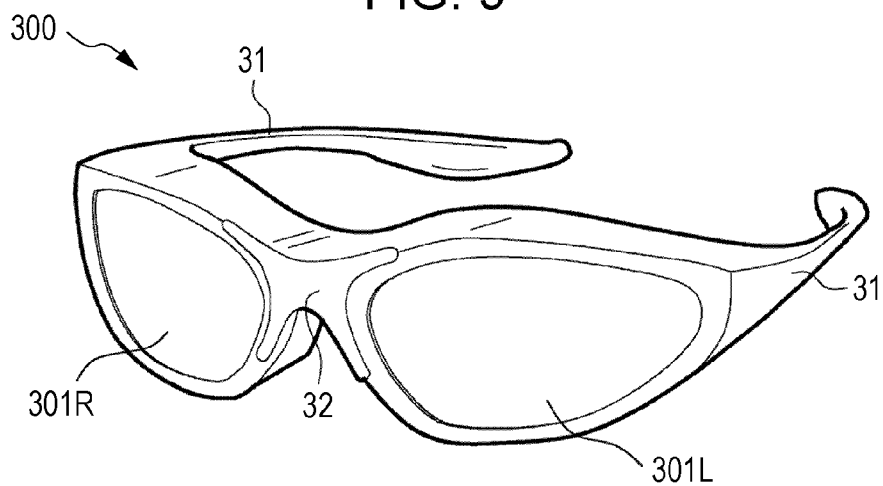
FIG. 9 is a perspective view which shows a head-mounted display which is an example of an electronic apparatus of the invention.
Figure 10:
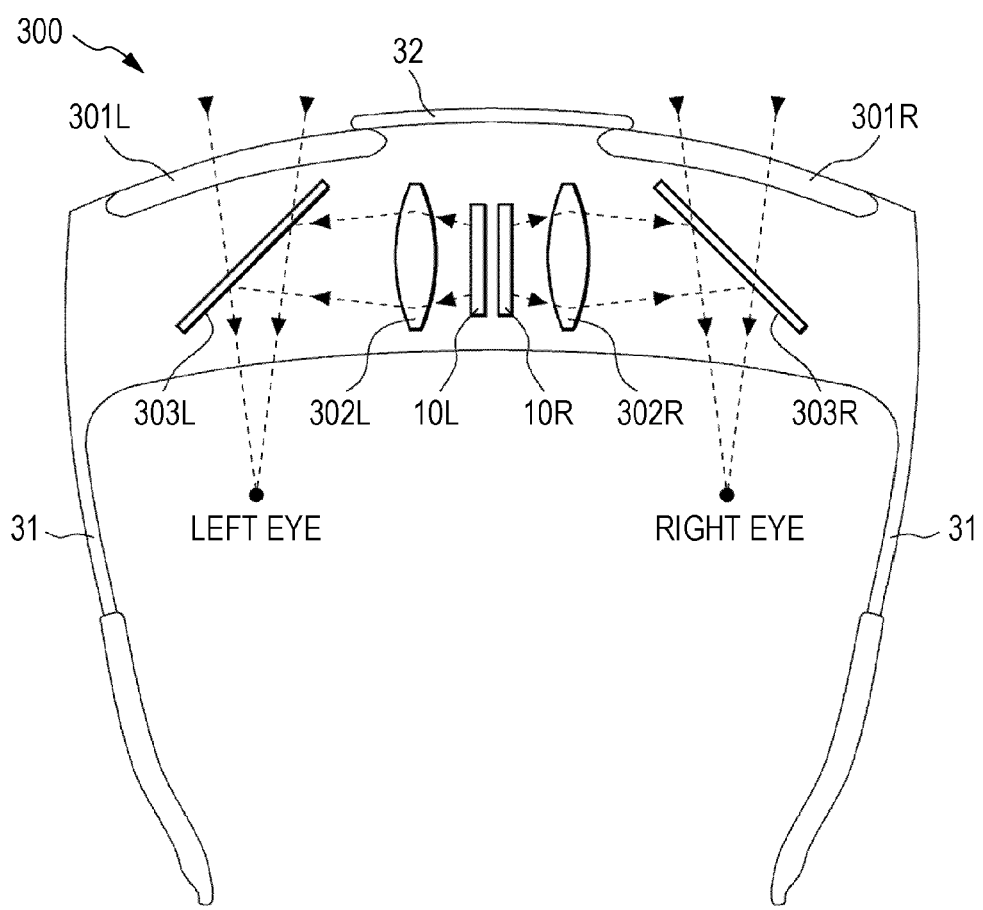
FIG. 10 is a diagram which shows an optical configuration of the head-mounted display.

FIG. 9 is a view which shows the appearance of the head-mounted display. FIG. 10 is a diagram which shows an optical configuration of the head-mounted display.

As shown in FIG. 9, the appearance of a head-mounted display 300 is the same as general glasses, and has a temple 31, a bridge 32, and lenses 301L and 301R. In the head-mounted display 300, as shown in FIG. 10, a micro-display 10L for left eye and a micro-display 10R for right eye are provided on a rear side (lower side of the figure) of the lenses 301L and 301R near the bridge 32.

An image display surface of the micro-display 10L for the left eye is arranged toward the left side in FIG. 10. Accordingly, a display image of the micro-display 10L is emitted toward the left side in the figure through the optical lens 302L. A half mirror 303L reflects the display image by the micro-display 10L toward the lower side in FIG. 10, and transmits light incident from above.

An image display surface of the micro-display 10R for right eye, contrary to the micro-display 10L, is arranged toward a right side in FIG. 10. Accordingly, a display image of the micro-display 10R is emitted toward the right side in the figure through an optical lens 302R. A half mirror 303R reflects the display image of the micro-display 10R toward the lower side in FIG. 10, and transmits light incident from above.

In the configuration, a wearer of the head-mounted display 300 can see display images of the micro-displays 10L and 10R in a transparent state of being overlapped with the exterior. In addition, when, among binocular images with parallax, a left-eye image is displayed on the micro-display 10L, and a right-eye image is displayed on the micro-display 10R in the head-mounted display 300, it is possible to perform a so-called 3D display, which allows a wearer to perceive the displayed images as if having a depth or a three-dimensional effect.

In addition to the head-mounted display 300, the micro-display 10 is even applicable to an electronic viewfinder in a video camera, a digital camera with interchangeable lenses, and the like.

The technical scope of the invention is not limited to the above embodiments, and various modifications can be added in a range without departing from the scope and spirit of the invention.

For example, an example of the temperature sensor including the band gap reference circuit is shown in the embodiment. However, without being limited to the band gap reference circuit, a temperature sensor including another circuit which outputs a temperature signal indicating a voltage according to temperature may be used. Furthermore, a configuration of the pixel circuit shown in FIG. 4 is not more than an exemplification, and the organic EL device may include a pixel circuit with another configuration.

In addition to the organic EL device, the invention can be applied to a semiconductor device such as a CMOS image sensor, a CCD image sensor, an infrared array sensor, and the like. In this case, the semiconductor device may include a semiconductor substrate, a pixel region provided on the semiconductor substrate, a terminal region including an external connection terminal provided on the semiconductor substrate, and a temperature sensor provided on the semiconductor substrate, and the temperature sensor may be provided between the pixel region and the terminal region.

The entire disclosure of Japanese Patent Application No. 2014-031841, filed Feb. 21, 2014 is expressly incorporated by reference herein.

What is claimed is:

1. An organic electroluminescence device comprising:
a substrate;
an organic electroluminescence element provided at a pixel region of the substrate;
a connection terminal provided at a terminal region of the substrate;
a temperature sensor provided above the substrate; and
a drive circuit provided at a drive circuit region that is outside the pixel region of the substrate, the drive circuit driving the organic electroluminescence element, wherein the temperature sensor is provided between the drive circuit region and the terminal region, and wherein the temperature sensor is provided between the pixel region and the terminal region.

2. The organic electroluminescence device according to claim 1, wherein the substrate is a semiconductor substrate.

3. The organic electroluminescence device according to claim 2, wherein the temperature sensor includes a band gap reference circuit formed above the semiconductor substrate.

4. An organic electroluminescence device comprising:
a substrate having an organic electroluminescence element, a connection terminal, and a temperature sensor,
wherein the organic electroluminescence element, the connection terminal, and the temperature sensor are on the substrate,
wherein the temperature sensor is provided between the organic electroluminescence element and the connection terminal.

5. The organic electroluminescence device according to claim 4, further comprising a drive circuit for driving the organic electroluminescence element,
wherein the temperature sensor is provided between the drive circuit and the connection terminal.

6. A semiconductor device comprising:
a semiconductor substrate;
an pixel provided at a pixel region of the semiconductor substrate; a connection terminal provided at a terminal region of the semiconductor substrate; and
a temperature sensor provided on the semiconductor substrate,
wherein the temperature sensor is provided between the pixel region and the terminal region.

7. An electronic apparatus comprising the organic electroluminescence device according to claim 1.

8. An electronic apparatus comprising the organic electroluminescence device according to claim 2.

9. An electronic apparatus comprising the organic electroluminescence device according to claim 3.

10. An electronic apparatus comprising the organic electroluminescence device according to claim 4.

11. An electronic apparatus comprising the organic electroluminescence device according to claim 5.

* * * * *